United States Patent
Furuta

(10) Patent No.: US 8,269,331 B2
(45) Date of Patent: Sep. 18, 2012

(54) POWER SEMICONDUCTOR MODULE

(75) Inventor: Norifumi Furuta, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 611 days.

(21) Appl. No.: 11/886,264

(22) PCT Filed: Mar. 16, 2006

(86) PCT No.: PCT/JP2006/305770
§ 371 (c)(1),
(2), (4) Date: Sep. 13, 2007

(87) PCT Pub. No.: WO2006/101150
PCT Pub. Date: Sep. 28, 2006

(65) Prior Publication Data
US 2008/0192437 A1    Aug. 14, 2008

(30) Foreign Application Priority Data

Mar. 23, 2005  (JP) ................................. 2005-084361
Mar. 14, 2006  (JP) ................................. 2006-069326

(51) Int. Cl.
*H01L 25/07* (2006.01)
(52) U.S. Cl. ................................ 257/687; 257/E23.057
(58) Field of Classification Search .................. 257/687, 257/712, 722, E23.057
See application file for complete search history.

(56) References Cited

U.S. PATENT DOCUMENTS

| 4,454,529 A | * | 6/1984 | Philofsky et al. ............. 257/684 |
| 6,181,590 B1 | | 1/2001 | Yamane et al. |
| 6,215,679 B1 | | 4/2001 | Yamane et al. |
| 6,327,165 B1 | * | 12/2001 | Yamane et al. ............... 363/132 |
| 6,642,576 B1 | * | 11/2003 | Shirasawa et al. ........... 257/328 |
| 2001/0033477 A1 | | 10/2001 | Inoue et al. |
| 2004/0115864 A1 | | 6/2004 | Sakurai et al. |

FOREIGN PATENT DOCUMENTS

| DE | 196 15 112 A1 | 10/1997 |
| EP | 0 586 793 A2 | 3/1994 |

(Continued)

OTHER PUBLICATIONS

Notice of Grounds of Rejection issued Sep. 21, 2010 in Japanese Patent Application No. 2006-069326 with English translation.

*Primary Examiner* — Thomas L Dickey
(74) *Attorney, Agent, or Firm* — Oliff & Berridge, PLC

(57) ABSTRACT

A power semiconductor element and a capacitor have their electrodes joined to each other in a module. The power semiconductor element is formed on a semiconductor substrate having first and second main surfaces. A power semiconductor module includes an electrode through which a main current flows, joined to the first main surface, an electrode through which the main current flows, joined to the second main surface, and a resin portion sealing the semiconductor substrate, the capacitor and the electrodes. The capacitor includes electrodes. The electrode of the capacitor and the electrode of the semiconductor element are joined to each other by solder such that surfaces exposed through the resin portion are arranged on one continuous surface on which a cooler can be attached. Therefore, a power semiconductor module can be provided in which the capacitor and the power semiconductor element can effectively be cooled and the surge voltage can be reduced.

7 Claims, 6 Drawing Sheets

FOREIGN PATENT DOCUMENTS

| | | |
|---|---|---|
| EP | 1 231 639 A1 | 8/2002 |
| JP | U-57-8756 | 1/1982 |
| JP | A 5-161253 | 6/1993 |
| JP | A 6-209562 | 7/1994 |
| JP | A 2000-092847 | 3/2000 |
| JP | A-2001-320005 | 11/2001 |
| JP | A-2002-057173 | 2/2002 |
| JP | A-2004-152982 | 5/2004 |

* cited by examiner

POWER SEMICONDUCTOR MODULE

TECHNICAL FIELD

The present invention relates to a semiconductor module and, more specifically, to a power semiconductor module containing a capacitor.

BACKGROUND ART

Recently, cars that employ an AC motor as a power source for maneuvering the car and has an inverter apparatus mounted for driving the AC motor are becoming popular, as represented by electric cars, gas-electric hybrid cars and fuel-cell-powered cars.

For a car of such type, it is required to make smaller the driving apparatus that drives the AC motor with the inverter apparatus. The inverter apparatus generally consists of a switching element such as an IGBT (insulated gate type bipolar transistor) and a rectifying diode element. To attain smaller size, it is sometimes provided as a module. It is often the case that a capacitor for surge absorption is placed close to the switching element.

In a hybrid car that has severe cost and space restrictions, it is difficult to use a single part IGBT element and a single part capacitor element combined together, as such combination would increase cost and space.

Japanese Patent Laying-Open No. 2000-92847 discloses a semiconductor module apparatus with capacitor that realizes superior surge resistance performance. An external case of the semiconductor module fixes a smoothing capacitor while pressing the capacitor to a cooling base. Therefore, assembly and fixing of the capacitor can be simplified, while cooling characteristic of the capacitor can be assured.

According to the technology disclosed in Japanese Patent Laying-Open No. 2000-92847, the shapes of the capacitor and of a power module containing power elements such as the IGBT are adapted to facilitate assembly. The capacitor, however, is still fixed by screws to terminals of the power module. Therefore, there is still a room for improvement to make shorter the physical distance between the power element and the capacitor, and to reduce inductance component of the fixing portion. Further, the technology addresses attachment of the cooler only on one side of the power element, and therefore, there is still a room for improvement in view of cooling performance.

Further, better mileage is required of a hybrid car, and to meet the requirement, decrease in switching loss is essential. In order to decrease switching loss, switching at a higher speed than in the conventional art is necessary. High-speed switching, however, increases surge voltage generating at opposing ends of the switching element, making it necessary to add a snubber circuit.

A snubber circuit is for preventing a high spike voltage that generates in a state of transition at the time of switching, in a switching circuit that turns on/off the current flow. The spike current results from inductance component of lines on the current flow path, and it is particularly large at the moment when the switch turns off.

Typically, a portion where a power semiconductor is mounted and a portion where the capacitor of a snubber circuit is placed are apart by a distance, and these portions are connected by a bus bar. The bus bar, however, has inductance component, and hence, energy stored therein would undesirably be reflected as a surge voltage.

DISCLOSURE OF THE INVENTION

An object of the present invention is to provide a power semiconductor module in which the capacitor and the power semiconductor element can be cooled satisfactorily and the surge voltage can be reduced.

In short, the present invention provides a power semiconductor module including a power semiconductor element, and a capacitor connected to the power semiconductor element. The power semiconductor element and the capacitor have their electrodes coupled to each other in the module.

Preferably, the power semiconductor element is formed on a semiconductor substrate having first and second main surfaces. The power semiconductor module further includes: a first electrode through which a main current flows, joined to the first main surface; a second electrode through which the main current flows, joined to the second main surface; and a resin portion sealing the semiconductor substrate, the capacitor and the first and second electrodes. The capacitor includes third and fourth electrodes. The first and the third electrodes are joined to each other such that surfaces exposed through the resin portion are arranged on one, same continuous plane.

More preferably, the power semiconductor module further includes a cooler attached to the surfaces exposed through the resin portion of the first and third electrodes.

More preferably, in the power semiconductor module, the second and fourth electrodes are joined to each other such that surfaces exposed through the resin portion are arranged on one, same continuous plane.

More preferably, the power semiconductor module further includes a cooler for cooling the capacitor and the power semiconductor element. The cooler includes a first cooling portion attached commonly on the surfaces exposed through the resin portion of the first and third electrodes, and a second cooling portion attached commonly on the surfaces exposed through the resin portion of the second and fourth electrodes.

More preferably, the first and second cooling portions are arranged to sandwich the power semiconductor element and the capacitor from opposite sides.

More preferably, the power semiconductor module further includes first and second terminals respectively joined to the third and fourth electrodes, for taking out the main current.

More preferably, the power semiconductor module further includes a control electrode electrically connected to the semiconductor substrate and receiving as an input a control signal for controlling the main current.

Therefore, a main advantage of the present invention is that, as the electrodes of the capacitor and the electrodes of the semiconductor element are arranged to be directly coupled to each other, the L component (inductance) and resistance component of the interconnecting lines can be reduced, and the surge voltage can also be reduced.

BEST MODE FOR CARRYING OUT THE INVENTION

Figure 1:
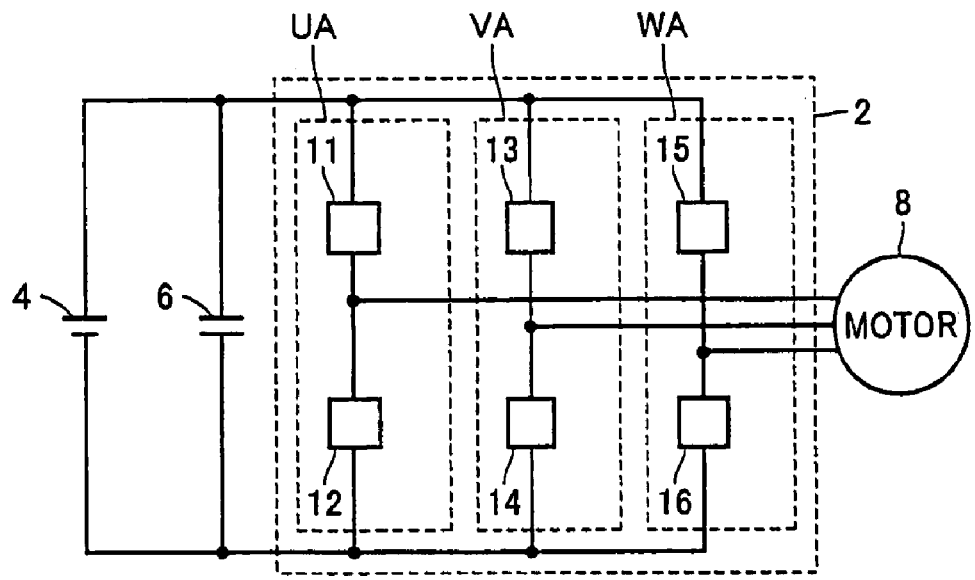
FIG. 1 is a circuit diagram illustrating a portion of a-motor driving system in a car, to which the power semiconductor module of the present invention is applied.

In the following, embodiments of the present invention will be described in detail with reference to the figures. Throughout the figures, the same or corresponding portions are denoted by the same reference characters and description thereof will not be repeated.

FIG. 1 is a circuit diagram illustrating a portion of a motor driving system in a car, to which the power semiconductor module of the present invention is applied. Such a motor driving system is mounted, for example, on an electric car, a hybrid car and a fuel-cell-powered car.

The car shown in FIG. 1 includes a battery 4, a smoothing capacitor 6, an inverter apparatus 2 and a motor 8.

Battery 4 is, by way of example, a secondary battery such as nickel-hydride or lithium-ion battery. Smoothing capacitor 6 and inverter apparatus 2 are connected in parallel, between positive and negative electrodes of battery 4.

Inverter apparatus 2 receives power supply potential smoothed by smoothing capacitor 6, and drives AC motor 8. Further, inverter apparatus 2 returns the power generated by AC motor 8 to battery 4, under regenerative control.

AC motor 8 is for generating torque that drives a driving wheel, not shown, of the car. When mounted on a hybrid car, for example, the motor may serve as a power generator driven by an engine, and also serves as an electric motor for the engine to start the operation of the engine.

Inverter apparatus 2 includes a U-phase arm UA, a V-phase arm VA and a W-phase arm WA, connected in parallel between terminals of smoothing capacitor 6 to which the power supply voltage is applied.

The U-phase arm UA includes power semiconductor modules 11 and 12 connected in series between terminals of smoothing capacitor 6. The V-phase arm VA includes power semiconductor modules 13 and 14 connected in series between terminals of smoothing capacitor 6. The W-phase arm WA includes power semiconductor modules 15 and 16 connected in series between terminals of smoothing capacitor 6.

A connection node between power semiconductor modules 11 and 12 is connected to one end of a U-phase coil, not shown, of motor 8. A connection node between power semiconductor modules 13 and 14 is connected to one end of a V-phase coil, not shown, of motor 8. A connection node between power semiconductor modules 15 and 16 is connected to one end of a W-phase coil, not shown, of motor 8. The U-phase coil, V-phase coil and W-phase coil each have the other end coupled together to the midpoint.

Figure 2:
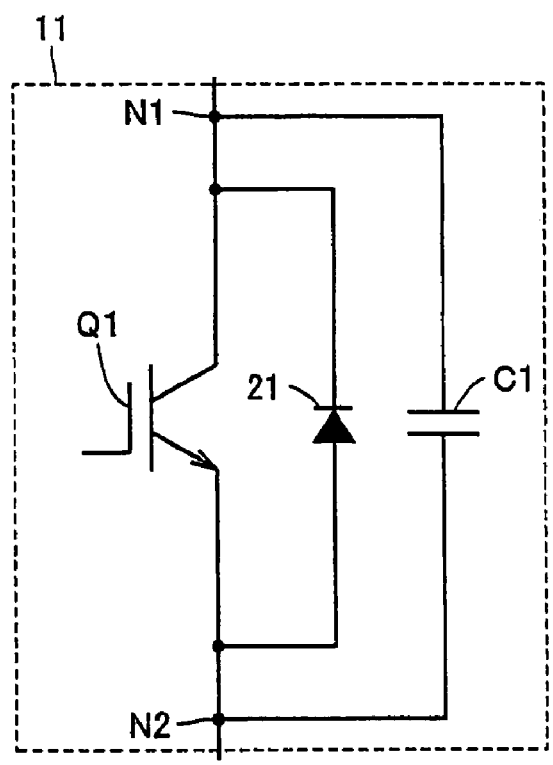
FIG. 2 is a circuit diagram representing the configuration of a power semiconductor module 11 shown in FIG. 1.

FIG. 2 is a circuit diagram representing the configuration of a power semiconductor module 11 shown in FIG. 1.

Referring to FIG. 2, power semiconductor module 11 includes a capacitor C1 connected between nodes N1 and N2, an IGBT element Q1 having its collector connected to node N1 and its emitter connected to node N2, and a diode 21. Between nodes N1 and N2, a diode 21 is connected in parallel with power semiconductor module 11. Diode 21 is connected such that the forward direction is from node N2 to N1.

Capacitor C1 is a snubber capacitor, and it may have the capacitance value of about 0.1 µF. Specifically, the capacitance value may be far smaller than that of smoothing capacitor 6 of FIG. 1.

Figure 9:
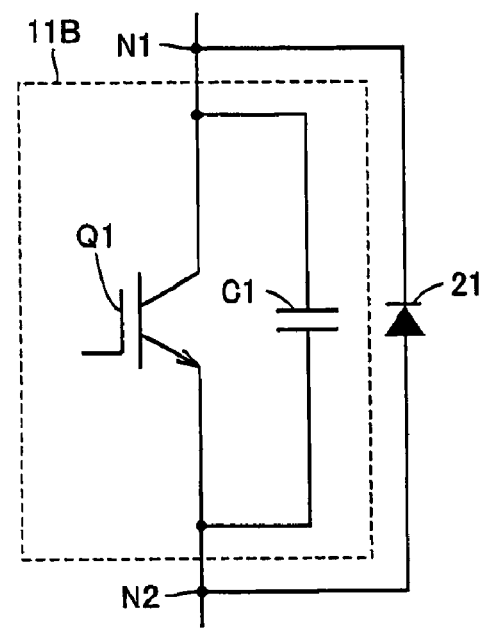
FIG. 9 is a circuit diagram showing a configuration of a power semiconductor module 11C in accordance with another modification.

Though an example in which power semiconductor module includes diode 21 is shown in FIG. 2, diode 21 may be provided outside power semiconductor module 11, as shown later in FIG. 9.

The power semiconductor modules 12 to 16 shown in FIG. 1 have the same structure as power semiconductor module 11, and therefore, description thereof will not be repeated.

Figure 3:
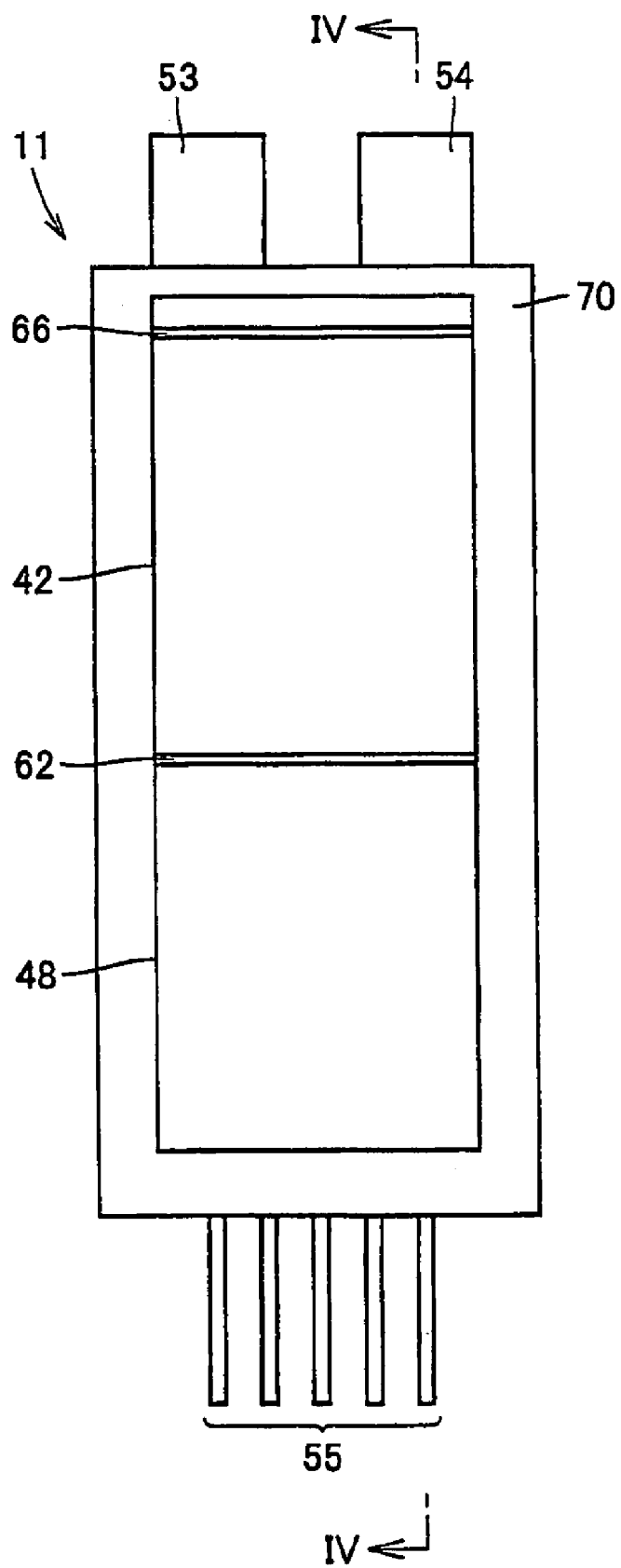
FIG. 3 is a front view of power semiconductor module 11.

FIG. 3 is a front view of power semiconductor module 11.

Figure 4:
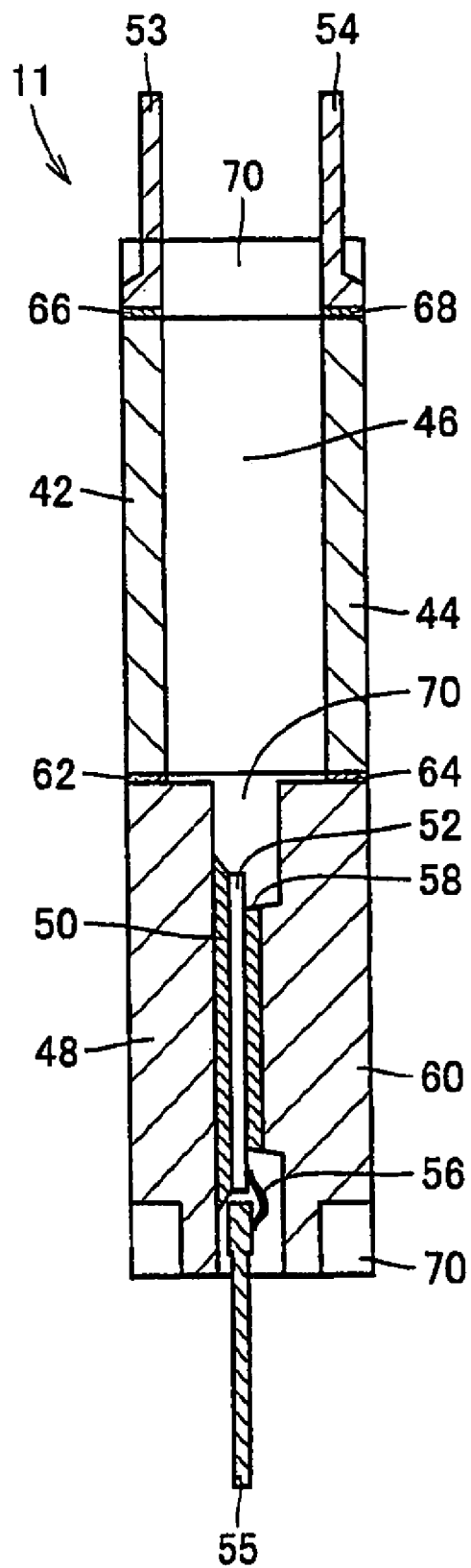
FIG. 4 is a cross-sectional view of power semiconductor module 11 taken along the line IV-IV of FIG. 3.

FIG. 4 is a cross-sectional view of power semiconductor module 11 taken along the line IV-IV of FIG. 3.

Referring to FIGS. 3 and 4, power semiconductor module 11 includes a power semiconductor element 52, and a capacitor 46 connected to power semiconductor element 52. Power semiconductor element 52 and capacitor 46 have their electrodes joined to each other in the module. Capacitor 46 corresponds to capacitor C1 shown in FIG. 2. Further, power semiconductor element 52 corresponds to IGBT element Q1 and diode 21 of FIG. 2.

Power semiconductor element 52 is formed on a semiconductor substrate having first and second main surfaces. Power semiconductor module 11 further includes: an electrode 48 through which the main current flows, joined to the first main surface by a solder layer 50; an electrode 60 through which the main current flows, joined to the second main surface by a solder layer 58; and a resin portion 70 sealing the semiconductor substrate, capacitor 46 and electrodes 48 and 60.

Electrodes 48 and 60 also serve as heat sinks, that is, heat transmitting member that effectively radiates heat from the semiconductor substrate to the outside.

Capacitor 46 includes electrodes 42 and 44. Electrodes 48 and 42 are joined to each other by solder 62 such that surfaces exposed from the resin portion are arranged on one same continuous surface that allows attachment of the cooler. Electrodes 60 and 44 are joined to each other by solder 64 such that surfaces exposed from the resin portion are arranged on one same continuous surface that allows attachment of the cooler. Therefore, both surfaces of power semiconductor module 11 can easily be attached to a radiator. An example in which the one same continuous surface is flat is shown in FIG. 4. When the surface to which the radiator is attached is a curved surface, electrodes 42 and 48 may have their surfaces shaped to conform to the curve, and electrodes 42 and 48 may be joined by solder 62 such that the electrode surfaces form a continuous surface.

By arranging capacitor 46 very close to power semiconductor element 52 and connecting without the fastening portion, the L component (inductance) of the bus bar conventionally used for connection of these components can be eliminated as much as possible and the effect of the snubber circuit for removing the surge can be improved.

Power semiconductor module 11 further includes: a terminal 53 joined to electrode 42 by solder 66, for taking out the main current; and a terminal 54 joined to electrode 44 by solder 68, for taking out the main current. Electrodes 53 and 54 are bus bars, which are connected to a power supply line of the inverter or to an output line.

Power semiconductor module 11 further includes a control electrode 55 electrically connected to the semiconductor substrate by a wire 56, for receiving as an input a control signal for controlling the main current.

Electrode 48 and terminal 53 are divided, and electrode 60 and terminal 54 are divided, and therefore, capacitor 46 can be arranged to occupy the entire thickness of power semiconductor module, and hence its capacity can be increased.

Figure 5:
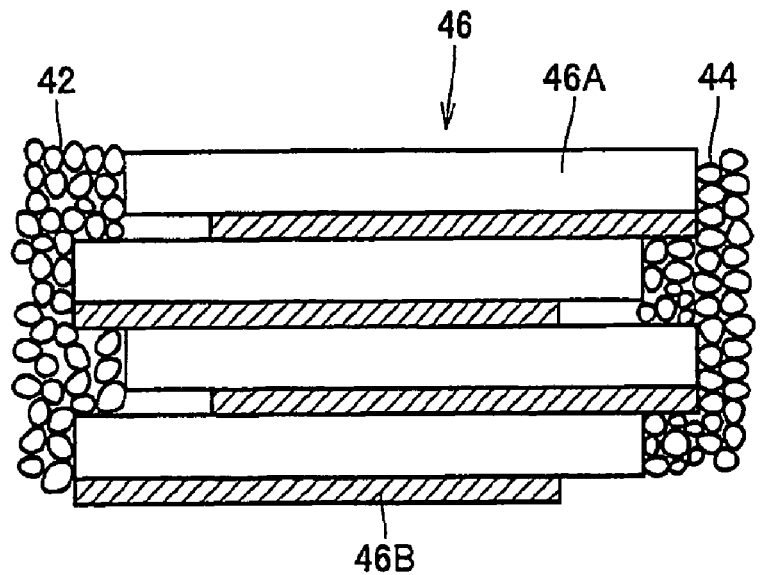
FIG. 5 shows a detailed structure of the cross-section of a capacitor 46 shown in FIG. 4.

FIG. 5 shows a detailed structure of the cross-section of a capacitor 46 shown in FIG. 4.

Figure 6:
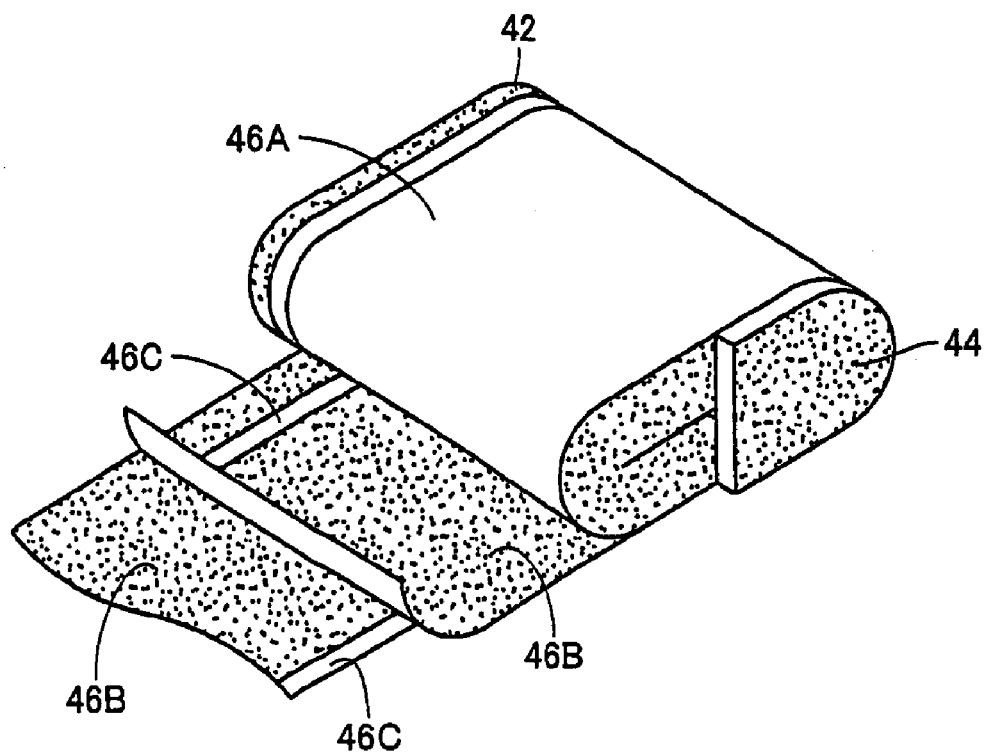
FIG. 6 is a schematic perspective view illustrating the structure of capacitor 46.

FIG. 6 is a schematic perspective view illustrating the structure of capacitor 46.

Referring to FIGS. 5 and 6, insulating films 46A of polyethylene terephthalate (PET) or polypropylene (PP) are laminated. Evaporated metal layer 46B such as aluminum is formed on insulating film 46A.

Specifically, two strip-shaped insulating films are laminated by winding, with the two films being slightly deviated from each other. The two insulating films have margins 46C formed at different positions, that is, one has the margin 46C formed on the side of electrode 42 and the other has the margin 46C formed on the side of electrode 44. After winding, electrodes 42 and 44 are formed on opposite sides, by sprayed metal referred to as "metallicon".

Though an example using a film capacitor as capacitor 46 has been described with reference to FIGS. 5 and 6, a capacitor of different type, such as a ceramic multiplayer capacitor may be used.

Figure 7:
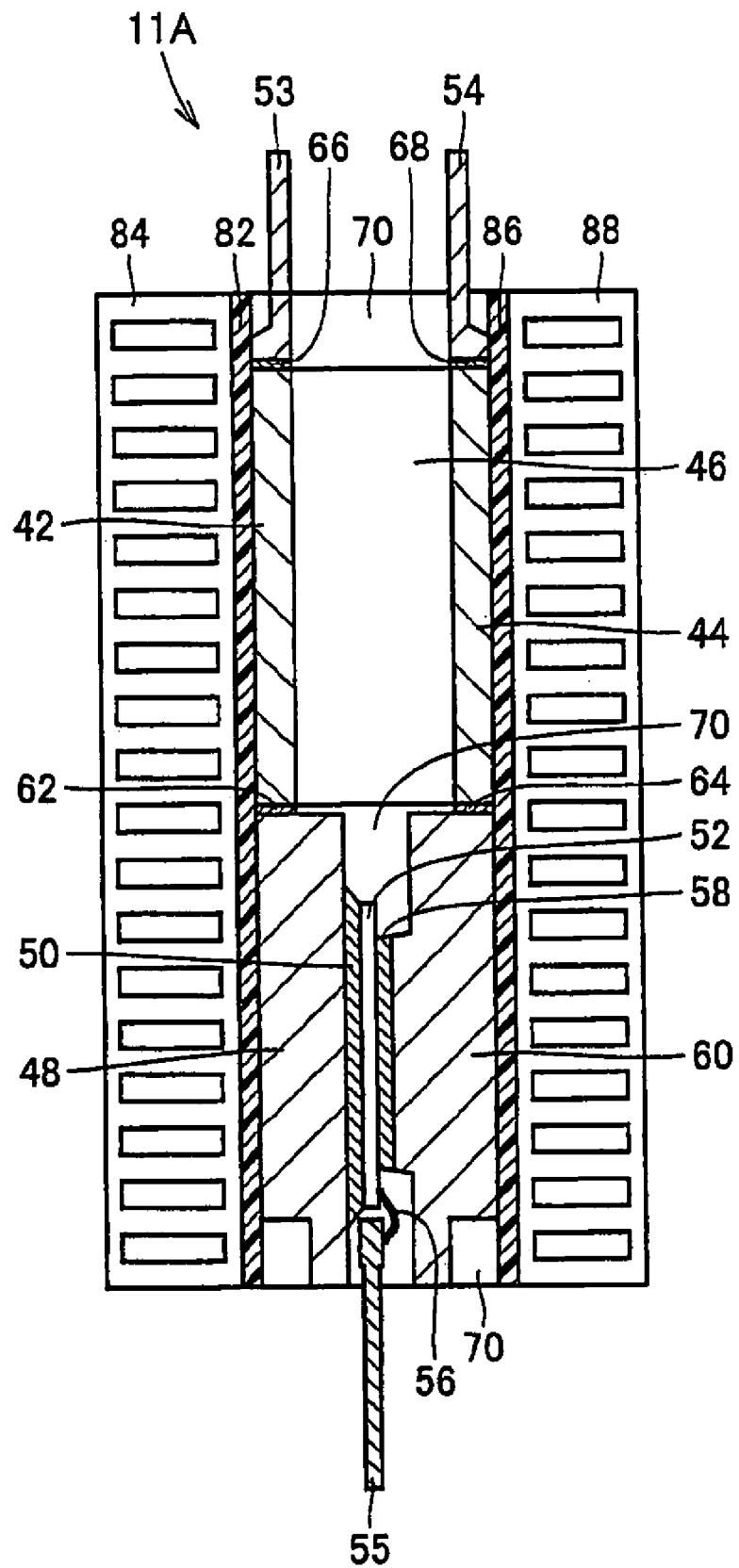
FIG. 7 is a cross-sectional view showing the power semiconductor module with a cooler attached.

FIG. 7 is a cross-sectional view showing the power semiconductor module with a cooler attached.

Referring to FIG. 7, power semiconductor module 11A includes, in addition to the configuration of power semiconductor module 11 described with reference to FIGS. 3 and 4, a cooler for cooling capacitor 46 and power semiconductor element 52. The cooler includes: a micro-channel cooling unit 84 formed of aluminum, attached commonly to surfaces of electrodes 42 and 48 exposed through the resin portion, with an insulating resin 82 interposed; and a micro-channel cooling unit 88 formed of aluminum, attached commonly to surfaces of electrodes 44 and 60 exposed through the resin portion, with an insulating resin 86 interposed.

Micro-channel cooling units 84 and 88 are arranged to hold power semiconductor element 52 and capacitor 46 therebetween.

Heat resistance of the film of a film capacitor is about 95° C. and relatively low. Considering that the heat generated by the capacitor itself must be exhausted and that the capacitor receives heat as it is positioned as close as possible to the power semiconductor element to effectively serve as the snubber capacitor, cooling is indispensable. The arrangement shown in FIG. 7 enables simultaneous cooling of the power semiconductor element and the capacitor.

Figure 8:
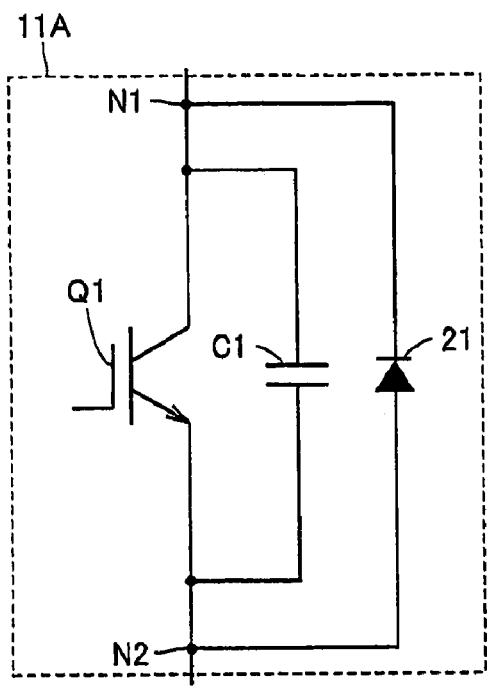
FIG. 8 is a circuit diagram showing a configuration of a power semiconductor module 11B in accordance with a modification.

It is noted that the connecting position of capacitor C1 and diode 21 may be changed as in a power semiconductor module 11B shown in FIG. 8. Specifically, in the example of FIG. 2, diode 21 is connected inside and capacitor C1 is connected outer than that, capacitor C1 may be connected inside and diode 21 may be connected outer than that as shown in FIG. 8. Further, a power semiconductor module 11C such as shown in FIG. 9 is also possible, which includes IGBT element Q1 and capacitor C1, with diode 21 connected outside.

Though an IGBT element has been described as an example of a power switching element in the present embodiment, an MOS transistor or the like may be included as the power switching element.

As described above, in the embodiment of the present invention, the snubber capacitor is arranged very close to the power semiconductor element, whereby the L component (inductance) and resistance component of the interconnecting line portion can be reduced and the surge voltage can be reduced.

Further, the snubber capacitor of which temperature increases because of self-heating and heat from the periphery of the power semiconductor element can be cooled simultaneously with the power semiconductor element.

Further, the number of components is reduced and the semiconductor module becomes compact, so that handling becomes easier and mounting and packaging are facilitated.

Although the present invention has been described and illustrated in detail, it is clearly understood that the same is by way of illustration and example only and is not to be taken by way of limitation, the spirit and scope of the present invention being limited only by the terms of the appended claims.

The invention claimed is:

1. A power semiconductor module, comprising:
a power semiconductor element; and
a capacitor connected to the semiconductor element; wherein
the power semiconductor element and the capacitor each have electrodes joined to each other in the module, and
the power semiconductor element is formed on a single semiconductor substrate having first and second main surfaces, the first and second main surfaces facing in opposite directions;
the power semiconductor module further comprising:
a first electrode through which a main current flows, joined to the first main surface of the single semiconductor substrate;
a second electrode through which the main current flows, joined to the second main surface of the single semiconductor substrate;
a resin portion sealing the single semiconductor substrate, the capacitor and the first and second electrodes; and
a cooler cooling the capacitor and the power semiconductor element; wherein
the capacitor includes third and fourth electrodes;
the first electrode and the third electrode are joined to each other using a first portion of solder such that the surfaces of the first electrode, the third electrode, and the first portion of solder form a first continuous surface where the first continuous surface is exposed through the resin portion; and
the second electrode and the fourth electrode are joined to each other using a second portion of solder such that the surfaces of the second electrode, the fourth electrode, and the second portion of solder form a second continuous surface where the second continuous surface is exposed through the resin portion;
the cooler includes:
a first cooling portion attached on the first continuous surface and
a second cooling portion attached on the second continuous surface.

2. The power semiconductor module according to claim 1, further comprising a cooler attached on surfaces exposed through the resin portion of the first and third electrodes.

3. The power semiconductor module according to claim 1, wherein
the first and second cooling portions are arranged to sandwich the power semiconductor element and the capacitor from opposite sides.

4. The power semiconductor module according to claim 1, further comprising first and second terminals respectively joined to the third and fourth electrodes, for taking out the main current.

5. The power semiconductor module according to claim 4, further comprising a control electrode electrically connected to the single semiconductor substrate and receiving as an input a control signal for controlling the main current.

6. The power semiconductor module according to claim 1, wherein the power semiconductor element and the capacitor are directly coupled to each other in the module.

7. The power semiconductor module according to claim 1, wherein the power semiconductor element is sandwiched between the first and second electrodes.

\* \* \* \* \*